(12) United States Patent
Staufert

(10) Patent No.: US 7,055,987 B2
(45) Date of Patent: Jun. 6, 2006

(54) LED-LUMINOUS PANEL AND CARRIER PLATE

(75) Inventor: Gerhard Staufert, Zofingen (CH)

(73) Assignee: Lucea AG, Zug (CH)

( * ) Notice: Subject to any disclaimer, the term of this patent is extended or adjusted under 35 U.S.C. 154(b) by 233 days.

(21) Appl. No.: 10/489,116

(22) PCT Filed: Jun. 24, 2002

(86) PCT No.: PCT/CH02/00339

§ 371 (c)(1),
(2), (4) Date: Apr. 6, 2004

(87) PCT Pub. No.: WO03/023857

PCT Pub. Date: Mar. 20, 2003

(65) Prior Publication Data

US 2004/0233671 A1    Nov. 25, 2004

(30) Foreign Application Priority Data

Sep. 13, 2001   (CH) .................................. 1700/01

(51) Int. Cl.
   *F21S 13/14*        (2006.01)
(52) U.S. Cl. ..................... 362/252; 362/294; 362/800; 313/500; 257/88; 361/624
(58) Field of Classification Search ................ 362/252, 362/545, 646, 800, 294; 361/624, 637, 648; 257/88; 313/500
See application file for complete search history.

(56) References Cited

U.S. PATENT DOCUMENTS

| 4,935,665 A |   | 6/1990  | Murata |
|---|---|---|---|
| 5,119,174 A | * | 6/1992  | Chen .......................... 362/800 |
| 5,278,432 A |   | 1/1994  | Ignatius et al. |
| 5,698,866 A |   | 12/1997 | Doiron et al. |
| 5,785,418 A | * | 7/1998  | Hochstein .................... 362/800 |

FOREIGN PATENT DOCUMENTS

| DE | 199 26 746 A1 | 12/2000 |
|---|---|---|
| EP | 1 081 771 A2  | 3/2001  |

OTHER PUBLICATIONS

Patent Abstracts of Japan, Publication No.: 58194383, Publication Date: Nov. 12, 1983, Continuously Assembled Light-Emitting Diode.
Patent Abstracts of Japan, Publication No.: 01086573, Publication Date: Mar. 31, 1989, Light Emitting Device.

(Continued)

*Primary Examiner*—Stephen F Husar
(74) *Attorney, Agent, or Firm*—Rankin, Hill, Porter & Clark LLP

(57) ABSTRACT

The tailorable light-emitting panel contains smallest sub-units connected in parallel with, in each case, at least two light-emitting bodies connected in series and operable by way of electricity, for example light-emitting diodes (24). The light-emitting panel may later be severed into part pieces capable of functioning per se, with at least the size of a smallest sub-unit. The panel includes an electrically conducting base layer (21) and a cover layer (29) electrically insulated from the base layer. The, base layer (21) and the cover layer (29) function as connection surfaces for the electrical parallel contacting of the sub-units. Conductor paths (23) electrically insulated from the electrical connection surfaces serve for the electrical connection of the various light-emitting bodies (24) of the sub-units.

21 Claims, 6 Drawing Sheets

OTHER PUBLICATIONS

Patent Abstracts of Japan, Publication No.: 08008463, Publication Date: Jan. 12, 1996, Thin Type LED Dot Matrix Unit.

Patent Abstracts of Japan, Publication No.: 61145877, Publication Date: Jul. 3, 1986, LED Array Head.

WO 99/57951, A Printed Circuit Board and a Method of Processing Printed Circuit Boards, Publication date: Nov. 11, 1999.

WO 99/41785, Adaptable LED Light Panel, Publication Date: Aug. 19, 1999.

* cited by examiner

LED-LUMINOUS PANEL AND CARRIER PLATE

BACKGROUND OF THE INVENTION

The invention relates to a tailorable light-emitting panel with light-emitting diodes, as well as to a carrier plate as a component of such.

A tailorable light-emitting panel is known from the document PCT/CH99/00051, which permits unhoused light-emitting diodes (LED-chips) to be connected in groups in series and parallel. The construction of the panel and the circuiting of the LEDS are designed such that the panel may be manufactured as an infinitely large surface. This surface may be separated into infinitely shaped part pieces as long as the size of these part pieces does not fall below a certain smallest sub-unit capable of functioning. The use of unhoused LED chips permits a selectively loose or compact arrangement of LEDs. In particular, a more compact arrangement than with conventional panels with housed light-emitting diodes is made possible. In conventional light-emitting panels, the LED density, depending on the cooling, reaches typical values in the region of approx. 4–9 LED/cm$^2$. The panel of the document PCT/CH99/00051 may be equipped with 25 LED/cm$^2$ without further ado.

A light-emitting panel is thus to be developed proceeding from the panel of the document PCT/CH99/00051, whose manufacture is further simplified. In particular, no complicated contacting of LEDs should need to be effected. The manufacturing costs, as a whole, should be reduced. Furthermore, the flexibility of the panel should be increased even further. It would be particularly desirable if an even more compact arrangement of LEDs were possible. The invention is directed to such a light-emitting panel.

SUMMARY OF THE INVENTION

The invention provides a light-emitting panel which is indeed simple in manufacture and is also suitable as an inexpensive mass product. A method for manufacturing such a light-emitting panel and a circuit board as an element of such a panel are also the subject-matter of the invention.

The tailorable light-emitting panel according to the invention contains the smallest of sub-units connected in parallel, with in each case at least two light-emitting bodies able to be operated with electricity and connected in series, for example light-emitting diodes. The light-emitting panel is later divided up into part pieces capable of functioning per se, with at least the size of a smallest sub-unit. The light-emitting panel comprises a base layer with an electrically conducting surface and a cover layer which is separated from this surface by way of an electrically insulating layer, wherein the base layer and the cover layer function as connection surfaces for the electrical parallel contacting of the sub-units. Electrically insulated conductor paths serve for the electrical connection of the various light-emitting bodies of the individual sub-units and are electrically insulated from the electrical contact surfaces.

The term "conductor paths" means at least one conductor layer separated into individual paths by structuring and, thus, a plurality of generally flat conductors present in or on an electrical connection element in a fixed manner. This is in contrast to later deposited conductors distanced to the base layer such as bonds, wire connections etc. The conductor paths have the advantage of a manufacture which has been standardized for some time and is thus inexpensive. Furthermore, according to preferred embodiments, the conductor paths permit a light-emitting body to be contacted directly on attachment to the conductor path—a significant simplification in manufacture.

The light-emitting panel, thus, more or less, has a carrier plate which forms or comprises an electrical connection element (for example circuit board) and light-emitting bodies attached thereon, as well as yet further units as the case may be.

One preferred embodiment of the light-emitting panel is designed such that the light-emitting bodies comprising for example two electrodes, are fastened directly on the base layer or a conductor path and are contacted by the same via one of the electrodes. For light-emitting bodies with an electrical contact on the base surface and with a second electrical contact on the cover surface, it is envisaged to fasten a first light-emitting body of each sub-unit with an electrically conducting contact means—for example a wire bond—directly on the conducting base layer and to simultaneously contact it. A commercially available electrically conductive adhesive (contact adhesive) or solder may be used as a contact means. Further light-emitting bodies of each sub-unit are, for example, deposited on a conductor path and are contacted by the conductor path.

There are also light-emitting bodies whose two electrical contacts are located on one and the same surface, namely the cover surface. The first light-emitting body of each sub-unit is then deposited on a conductor path with a not necessarily electrically conducting contact means, wherein the electrical contact between the base layer and the first electrical contact of the light-emitting means is ensured by way of a suitable electrical connection element, which leads from the contact surface of the light-emitting means through an opening in the insulating layer. For this, partial openings are necessary in the insulating layer. The insulating layer is, for example, formed by two insulating films, then the partial opening is an opening at least in the film which does not bear on the base layer. The respective second electrode of each light-emitting body may be electrically connected by way of a wire bond to a further conductor path or to a contact surface. "Bonding" is a standardized, automatic and economical method.

Alternatively to wire bonds, the electrical contacting of the light-emitting body electrodes may be ensured by way of conductor paths integrated in a flexible transparent layer. The conductor paths required for this may, for example, consist of an electrically conducting transparent layer, such as, for example, a so-called ITO-layer (In$_2$O$_3$—SnO$_2$). The conductor paths may, however, also be formed by a grid of very thin metallic conductor paths. The local dimensions either of the transparent conductor paths or of the conducting grid are preferably selected such that, without incorrect contacting, one requires no special alignment effort.

Suitable light-emitting bodies obtainable on the market are unhoused light-emitting diodes. These are offered in various designs. On the one hand, their base surface, for example, varies between 250×250 µm and 500×500 µm, and on the other hand, the two electrodes for the electrical contacting are either both arranged on the cover surface or one electrode is located on the cover surface and the second electrode on the base surface. In principle, one may use any light-emitting diodes. In many cases, however, light-emitting diodes with an electrically conducting substrate, for example SiC, are to be preferred since then a direct contacting of one electrode may be effected by way of depositing on a contact surface (as already mentioned) and since the heat arising in the active region is led downwards more efficiently by way of electrical conductors.

The panel according to the invention may have light-emitting diodes of a certain color or a certain color composition. One may, howeverm also use blue or also violet or ultraviolet light-emitting diodes, e.g. with GaN or InGaN layers, preferably in combination with fluorescence means. The blue or ultraviolet light emitted by the light-emitting bodies is at least partly converted into longer-waved light by way of secondary emitting dye. The original blue or ultraviolet light superimposes with the longer-waved light, wherein white light results from the sum. As the case may be, in combination with color filter means in an arrangement yet to be described, by way of the light-emitting panel according to the invention, white light may be created in a trueness to color which has not yet been surpassed. The use of suitable laser diodes is also conceivable, which have the advantage of a considerably higher light emission which, however, is limited to a relatively restricted spatial [solid] angle. Such laser diodes are furthermore relatively expensive.

The light-emitting panel is preferably designed such that the density of the arrangement of the light-emitting bodies may be adapted downwards beginning from a maximum. The maximal density is dependent on the distance of the openings in the insulating layer and the length, resulting from this, of the individual discrete conductor paths for electrically contacting the light-emitting bodies. If a smaller density of light-emitting bodies is desired, then, for example, two light-emitting bodies arranged at larger distances to one another for this purpose, are electrically connected to one another. Here, this is effected in that the two light-emitting bodies, in each case, are connected to the conductor path lying closest to them and additionally all discrete conductor paths lying on the direct line of connection between these two light-emitting bodies are electrically connected to one another by way of additional contact means.

Moreover, the light-emitting panel is designed such that the sub-groups of light-emitting bodies, said sub-groups being connected to one another in series, may be supplemented by additional electrical components, for example resistors. These may be arranged on the conductor paths envisaged for the light-emitting bodies or be arranged directly next to these. A voltage adaptation for a complete sub-unit may thus be realized in that additionally a suitable resistance is connected in series to the light-emitting bodies of the sub-unit. One may realize a current adaptation for an individual or a group of light-emitting bodies by way of connecting a suitable resistance in parallel.

According to the design of a base layer, for additional stabilization, a light-emitting panel according to the invention may be deposited on a mechanical carrier, for example a plate.

The base layer may essentially be a metallic plate, for example, with spherical-calotte-shaped or parabolic recesses comprising a flat zone. One may deposit the light-emitting bodies on the flat zones in the recesses. This arrangement has the advantage that it gives a thin base layer mechanical stability, in particular, the rest surfaces for the light-emitting bodies.

The panel, as the case may be, has further addition layers by way of which the light emitted by the light-emitting bodies is directed.

According to one embodiment, one addition layer is a transparent protective layer. This layer protects the conducting and insulating layers, as well as the light-emitting diodes and the electrical connections, from external influences such as for example mechanical and chemical effects. They may also serve for directing the emitted light.

One example of an addition layer that simultaneously ensures a homogeneous light distribution is a soft-elastic silicone layer with integrated, small, light-reflecting particles. A light-emitting panel then, for example, has a suitable mixture of LEDs that emit light with the colors blue, green and red with suitable mixing ratios. A homogenizing layer is attached or deposited over this which ensures that the panel emits white light.

Another example for a transparent addition layer is one with a very high optical refractive index, such as titanium dioxide or ITO ($In_2O_3$—$SnO_2$), which has a refractive index of the order of 2.2. If this layer has approximately the thickness of half an LED-chip width and is structured such that it may also laterally couple out light, this is one possibility as a whole of significantly increasing the light quantity coupled out of an LED-chip. Additionally, as mentioned further above, a suitably structured ITO-layer may directly serve for electrically contacting the LED-chips.

A special advantage is brought about by a further optional addition layer. This addition layer comprises colors which change the wavelength of the light emitted from the LEDs (with such a layer it is the case amongst other things of a fluorescing layer, thus of a layer with a secondary emitting dye. The wavelength is "changed" in such a layer in that the primary light is absorbed and after the absorption process secondary light of another larger wavelength is emitted through the layer. This addition layer provided with dyes serves for example for converting short-wave primary light into white light. Particularly warm light arises if apart from a plurality of LEDs producing blue light or violet light one yet uses a few red light-emitting diodes and/or yellow light-emitting diodes. In contrast to the housed LEDs according to the state of the art, the essentially flat layer covering several LEDs serves for the color conversion of the light of a multitude of electrodes lying underneath. Thus, edge effects, for example, rings, are avoided, as they are known from housed electrodes. Incidentally, such a layer could also be used for arrays of LEDs other than the tailorable LED panel according to the invention.

The essentially flat layer into which the dye or the dye mixture is introduced, for example of silicon or PMMA, as the case may be, serves simultaneously as a protective layer above the LEDs or the whole panel.

A further optional addition layer which may be identical to the protective layer is essentially transparent and serves for producing a homogeneous light distribution and for reducing possible thermal stress.

The functions of the upper transparent layers may also be fulfilled by a single layer or by any combination of layers.

The addition layer may be designed as a covering layer that is mechanically decoupled from the light-emitting bodies, for example stiff and fixed on the carrier plate (=base layer with conductor structures and a mechanical carrier as the case may be) by way of spacers. This is particularly advantageous in combination with a base layer provided with the mentioned recesses for the light-emitting bodies. If the light-emitting bodies are incorporated in recesses, the covering layer may be attached relatively close to the base layer without the bond connections between light-emitting bodies and conductor paths being compromised and without shear stresses being able to act on the light-emitting bodies.

In a preferred embodiment the base layer is designed such that it serves for conducting away heat. For this it consists essentially of electrically conducting and heat conducting materials and comprises additional structures serving the cooling, for example cooling ribs.

The base layer and possibly also the one or several addition layers are preferably designed such that they comprise predetermined breaking locations. Predetermined breaking locations are local structures which indicate where the light-emitting panel may be subdivided into smaller functioning part pieces and preferably simultaneously simplify such a division into pieces. Examples of predetermined breaking locations are rows of missing cooling ribs or local thinning of layers. The light-emitting panel may be divided into pieces along such break-off locations up to the smallest functioning sub-units or groups of smallest functioning sub-units.

The size of a smallest sub-unit may differ, and typically contains two, three, four, five or six LEDs. A panel may have sub-units of different sizes. This is possible with the design of the panel according to the invention without further ado and without great design expense. An installation for the automatic manufacture of the panel need only be simply programmed such that the LEDs and the bonds, or as the case may be, additional electrical components such as resistors, are attached at the corresponding locations. If one further takes into account the fact that variously colored LEDs may be placed in any manner, one recognizes that practically no limits are made on the flexibility and the design possibilities.

Conducting and insulating layers and conductor paths are deposited, for example, with methods from circuit board technology, which are known per se. These, for example, include the photo-structuring of conductor paths, as well as the laminating-on of plastic layers or sputtering-on of other electrically insulating layers. The conductor paths may, of course, however, also be manufactured with newer circuit board technologies, for example with a newly developed embossing method. The deposition of addition layers is also effected in a manner known per se. By way of this, the manufacturing process of the light-emitting panel is considerably simplified since it may be automated, and the light-emitting panels according to the invention are obtainable as pre-manufactured serial products. The manufacturing costs for individual panels may thus be kept considerably low. A further advantage is the fact that all structures may be designed very thinly and thus have an extremely low heat-conducting resistance. This permits an effective conducting-away of heat from the region of the LEDs. Together with the optionally present cooling structures, a more compact arrangement of LEDs is made possible by way of this. In turn, the flexibility when using the panel is increased even more by way of this.

The grouped, series circuiting of LEDs furthermore permits the use of commercially available voltage supplies, such as transformers which typically operate with voltages of 12V or 24V. Commercially available LEDs may typically be operated with only 2V or 4V. A series connection of for example 6×2V, 3×4V, 4×2V+1×4V, etc., permits the supply voltage of the whole light-emitting panel or of part pieces of this to be applied considerably higher than would be possible for individual LEDs. By way of the series and/or parallel connection of additional electrical resistances to a smallest operative sub-unit or to individual light-emitting body sub-groups, no limits are set on the possibilities for adapting the voltage or adapting the current. If the smallest of operative sub-units are additionally connected to one another in parallel via a base layer, then a light-emitting panel or a part piece of this emits light as soon as two connections of an LED are supplied with the required voltage difference.

The use of a higher voltage not only has advantages with respect to the selection of voltage sources, but also reduces the flowing currents. This reduction permits a reduction of the conductor cross sections and reduces the production of heat. The electrical supply voltage may be chosen selectively as a constant voltage or as an alternating voltage. With the use of alternating voltage however a reduced efficiency must be accepted.

The light-emitting panel according to the invention is explained hereinafter by way of exemplary embodiments.

DETAILED DESCRIPTION OF THE PREFERRED EMBODIMENTS

Figure 1:
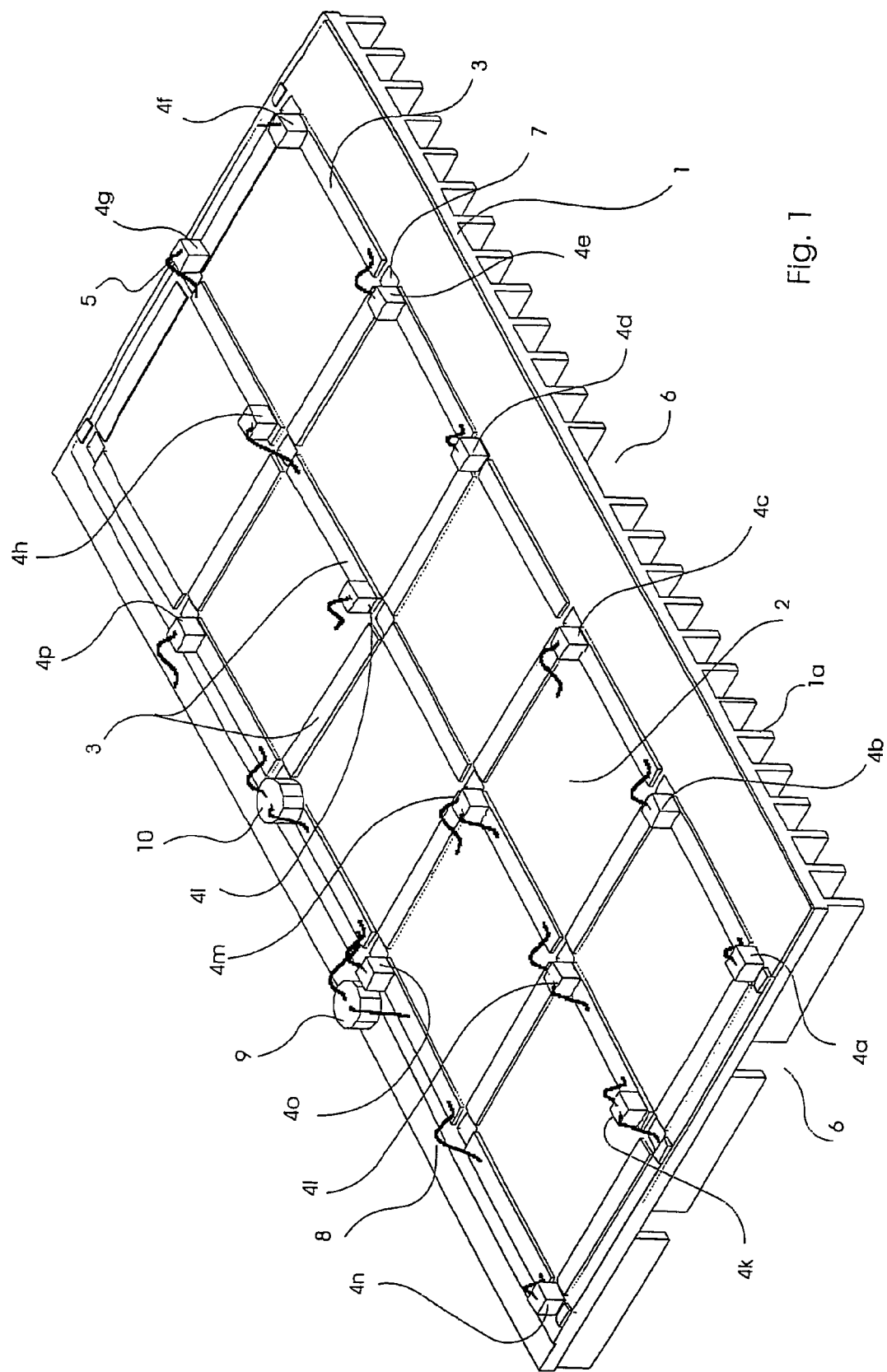
FIG. 1 shows a schematic oblique view of layers of a first example of a tailorable light-emitting panel according to the invention.

In FIG. 1, an electrically conducting base layer 1 is shown. In the drawn example, it is designed as an aluminium base plate provided with cooling ribs 1a. The base layer may also be constructed of several layers. If the cooling is not a problem on account of the LED density, then it may be formed as a plastic plate that is coated with a metal film. If mechanical strength is not required, or not desired, the base layer may also be formed by way of a conducting film. This may then be deposited on any object.

A first insulating film 2 provided with local openings 7 is deposited on the base layer 1. The film consists, for example, essentially of SiN, SiC, or polymers which are common in circuit board technology. It has a thickness, for example, of 0.5–50 μm. A regular, grid-like arrangement of conductor paths 3, for example, of copper is located on the first film 2. The conductor paths 3 are electrically separated from the base layer 1 by the first insulating film 2.

Four sub-units of light-emitting diode chips (LED-chips or LEDs for short) 4a, 4b, 4c, 4d, 4e, 4f, 4g, 4h, 4i, 4k, 4l, 4m, 4n, 4o, 4p are shown in the figure, which are attached and distributed on the base layer 1 and the conductor paths 3 and are fastened with conducting contact adhesive. With the exception of three LEDs 4k, 4l, 4m, they are contacted on the base side by the base layer 1 or a conductor path 3. Two first of the sub-units shown on the left in the figure have, in each case, three LEDs connected in series. The third sub-unit shown on the right is composed of 6 LEDs 4d, 4e, 4f, 4g, 4h, 4i connected in series.

Three sub-units, in each case, comprise an LED chip 4a, 4d, 4n which is deposited directly on the base layer 1 with its first electrical contact surface arranged on the lower side of the chip, and which, in the following, we will consider as the first LEDs of each sub-unit. The first LED-chip 4k of the second sub-unit (4k, 4l, 4m) is arranged on a conductor path 3 and, by way of a wire bond 5, is electrically connected from its first electrical contact surface to the base layer 1 through an opening 7. The first LEDs are, in each case, connected by a wire bond 5 to a conductor path 3 in each case from their second electrical contact surface arranged on the upper side of the chip. The further LEDs 4b, 4c, 4e, 4f, 4g, 4h, 4i, 4l, 4m, 4o, 4p which follow connected in series are, in each case, attached on a conductor path 3 which are connected to the or one of the top electrodes of the corresponding series connected LED chip by way of wire bonds 5. The top electrode of each last LED chip 4c, 4i, 4m, 4p in the series connection is contacted by a wire bond 5 which leads onto a cover layer which is not shown in the figure for the purpose of an improved overall view. In a fourth sub-unit, the light-emitting diodes 4n, 4o, 4p are arranged with double the distance. The electrical interruptions between the individual conductor paths 3 for the electrical series connection of the LEDs 4n, 4o, 4p caused by this are connected in one case by way of an additional wire bond as a conductor path contact means 8. In the second case, the conductor paths 3, for the purpose of voltage adaptation of the whole sub-unit, are bridged via an additional series connected resistance 10 and suitable wire bonds 5 for electrically contacting this. A further resistance 9 is arranged parallel to one of the light-emitting diodes 4o, which results in a current adaptation for this one light-emitting diode 4.

The base layer 1 is provided with break-off locations 6 along which an LED panel, which, for example, is one square meter in size, may be divided into part pieces up to a smallest sub-unit. The break-off locations 6 may also surround units that comprise several sub-units. The insulating film 2, the conductor paths 3 and the bonds 5 may be manufactured with means and techniques known in the manufacture of circuit boards.

It is mainly the differences of the embodiments shown in the drawings to the embodiments already described which are explained by way of the following figures. A description of common features is not made.

Figure 2:
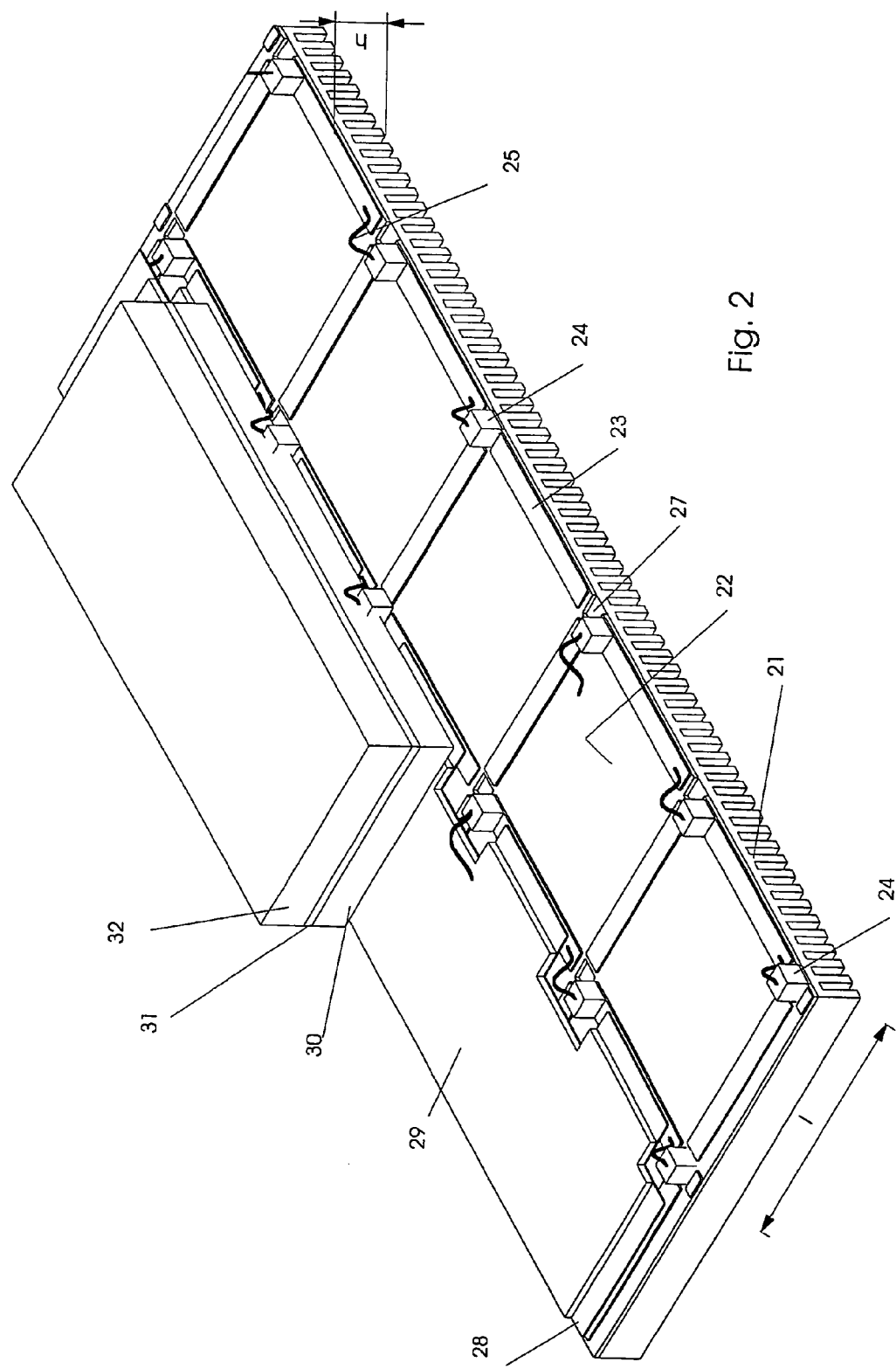
FIG. 2 shows a sectioned oblique view of the construction of a second example of a light-emitting panel according to the invention.

A schematic oblique view of the construction of a further embodiment of the light panel according to the invention is shown in FIG. 2. The circuit arrangement of this embodiment differs from that of FIG. 1 in that there are only sub-units present with, in each case, three LEDs connected in series. The electrically conducting cover layer 29 is also partly shown in this figure. One may additionally see addition layers 30–32 lying on this. The electrically conducting base layer 21 serves for the parallel contacting of series connected LED chips 24. The base layer 21 comprises cooling ribs for optimizing the cooling of the LED chips 24. The first insulating film 22 with a regular arrangement of openings 27 is deposited onto the base layer 21. The insulation layer 22 through these openings 27 may electrically contact the base layer 21. The discrete conductor paths 23 which serve for the series connection of the LED chips 24 are deposited onto the first insulation layer 22. A second electrically insulating film 28 with openings is located above the conductor paths 23. The first and second insulating film together form an insulating layer essentially embedding the conductor paths. At the same time, depending on the manufacturing method (depositing the layers at high or low temperatures) and layer material, the layer is homogeneous up to the circuit boards and structured along a separating plane lying between the films. The conducting cover layer 29 is likewise provided locally with openings and, together with the base layer 21, serves for the parallel contacting of the sub-units. The conducting cover layer 29 may, in principle, also be designed without openings if it is manufactured of a transparent electrical conductor, and a contact to the top-electrodes of the LEDs is, for example, created by way of pressing. In this case, the electrically insulating layer preferably has a total thickness that roughly corresponds to the dimensions of the LEDs. In place of a transparent electrical conductor, the cover layer may also consist of thin electrical conductor paths contacting the top-electrodes, or may be connected to such conductor paths.

The openings in the cover layer 29 may be designed such that they encompass the LED chips 24, as well as contactable surfaces of each adjacent conductor path. Thus, the cover layer may also be manufactured in an absolutely standardized manner, and permit any circuiting of the LEDs.

The conducting layer 29 may be designed in a mirroring manner in order to improve the efficiency of the light of the LEDs 24.

The sub-units of LEDs connected in series or the light-emitting panel or part pieces thereof emit light as soon as a constant voltage determined by the LEDs and their circuit arrangement is applied between the base layer 21 and the cover layer 29 which function as contact surfaces.

The thickness h of the base layer, including the cooling ribs, the electrically insulating layer and the cover layer, varies in a range between approx. 0.5 mm and a few mm, for example 3 mm. As already mentioned, the base layer may also be designed differently, for example without cooling ribs. In this case, the base layer is then, of course, correspondingly thinner. The values for the distance I from LED to LED is preferably approx. 1.4 mm–10 mm. This results in a light-emitting panel with an LED density of 1–49 LED/$cm^2$. A typical value for I is 2.5 mm, which results in a light-emitting panel with an LED density of 16 LED/$cm^2$. The LED density may be reduced or increased without further ado, wherein with the LEDs obtainable at present, an upper value would lie at roughly 64 LED/$cm^2$.

Three addition layers 30–32 are deposited over the circuit arrangement of the LED chips 24. The first, transparent addition layer 30 is a soft, elastic cover layer, e.g. a layer consisting essentially of silicone to which small reflecting particles are added. It serves for ensuring a homogeneous light distribution. The first addition layer 30 may furthermore serve for reducing thermal stress which endangers the LED chips 24.

The second addition layer 31 is provided essentially with secondary emitting dye or a dye mixture, for example with luminescence dye. In this case, the LEDs are selected, depending on the color mixture, such that they emit blue light. By way of the second transparent layer, light emitted from the LEDs is at least partly converted into longer-waved light. The light radiated as a sum is then a superposition of different wavelengths depending on the dye mixture. Depending on the color of the LEDs and the quantity and nature of the dye, a light-emitting panel according to the invention or part pieces of this may emit light in practically any color. The layer-like arrangement of the addition layers additionally leads to a homogeneous light distribution without edge effects. This is in contrast to housed LEDs according to the state of the art. The housing of these may be provided with a luminescence layer. This, however, always leads to anisotropic colour distribution which is perceived as rings by the observer.

The third addition layer 32 is transparent and serves as a protective layer. It consists, for example, essentially of PMMA or PET. It may also contain optical elements that direct the light according to the wishes. The protective layer 32 is manufactured of a material which has a certain UV resistance.

According to the design of the panel, the functions of the three addition layers 30–32, may also be realized with a single, with two or with four or more partly transparent layers. It is also to be understood that the functions fulfilled by the addition layers are not essential for the functioning of the panel and, thus, the addition layers may also be completely or partly omitted.

Figure 3:
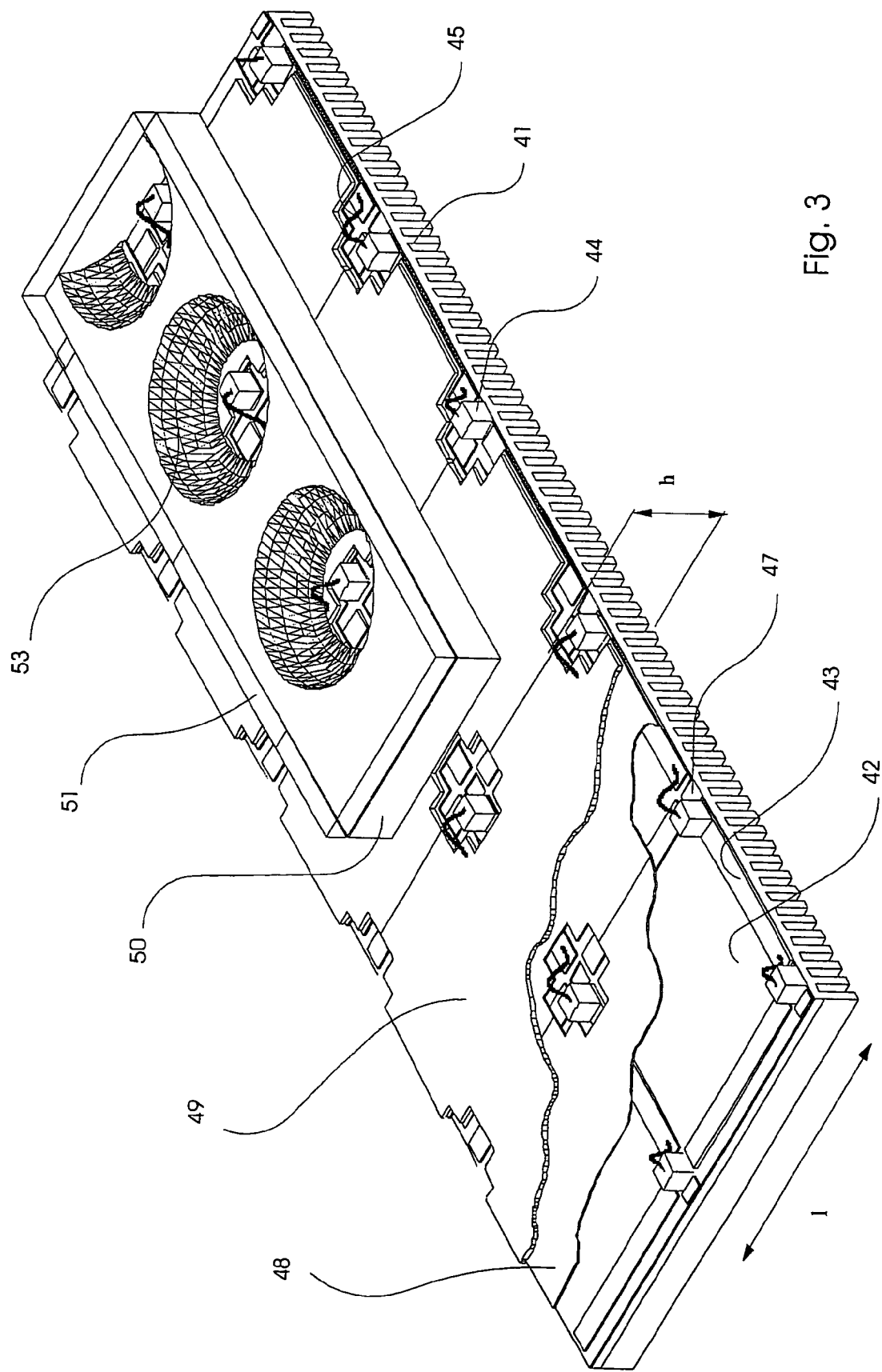
FIG. 3 shows an embodiment of the light-emitting panel according to the invention with concave-mirror-like structures.

A further embodiment of the light-emitting panel according to the invention is to be seen in FIG. 3. The panel has an electrically conducting base layer 41, a first and a second insulating film 42, 38, discrete conductor paths 43 for the series connection of the LED chips 44 and a conducting cover layer 49 with which the last LED chips of a series are connected by way of a wire bond 45. All layers, where required, comprise openings 47 for the electrical contacting.

Two addition layers 50, 51 are designed in a manner such that they have semi-shell-shaped recesses 53 around the LED chips. The semi-shell-shaped recesses are preferably coated with a mirroring layer, e.g. have silver or aluminium so that the recesses act as a concave mirror. The light emitted by the LEDs is limited to the spatial [solid] angle which is predetermined by the concave mirror. The recesses 53 may be manufactured into the soft, transparent layers 50, 51 by way of embossing. For protecting the LEDs and insulating and conducting layers 50, 51 as well as electrical connections and a possible concave coating, the recesses may be filled with a transparent protective material, such as silicone or PMMA for example. It is also possible to incorporate the recesses only into the first addition layer 50, for example a homogenizing layer and/or one containing secondary emitting dye. The first addition layer may otherwise be completely opaque and only be provided with reflecting surfaces. The transparent protective layer 51 covers the whole panel in a protective manner, in particular also the LED chips and the semi-shell-shaped recesses 53.

Figure 4:
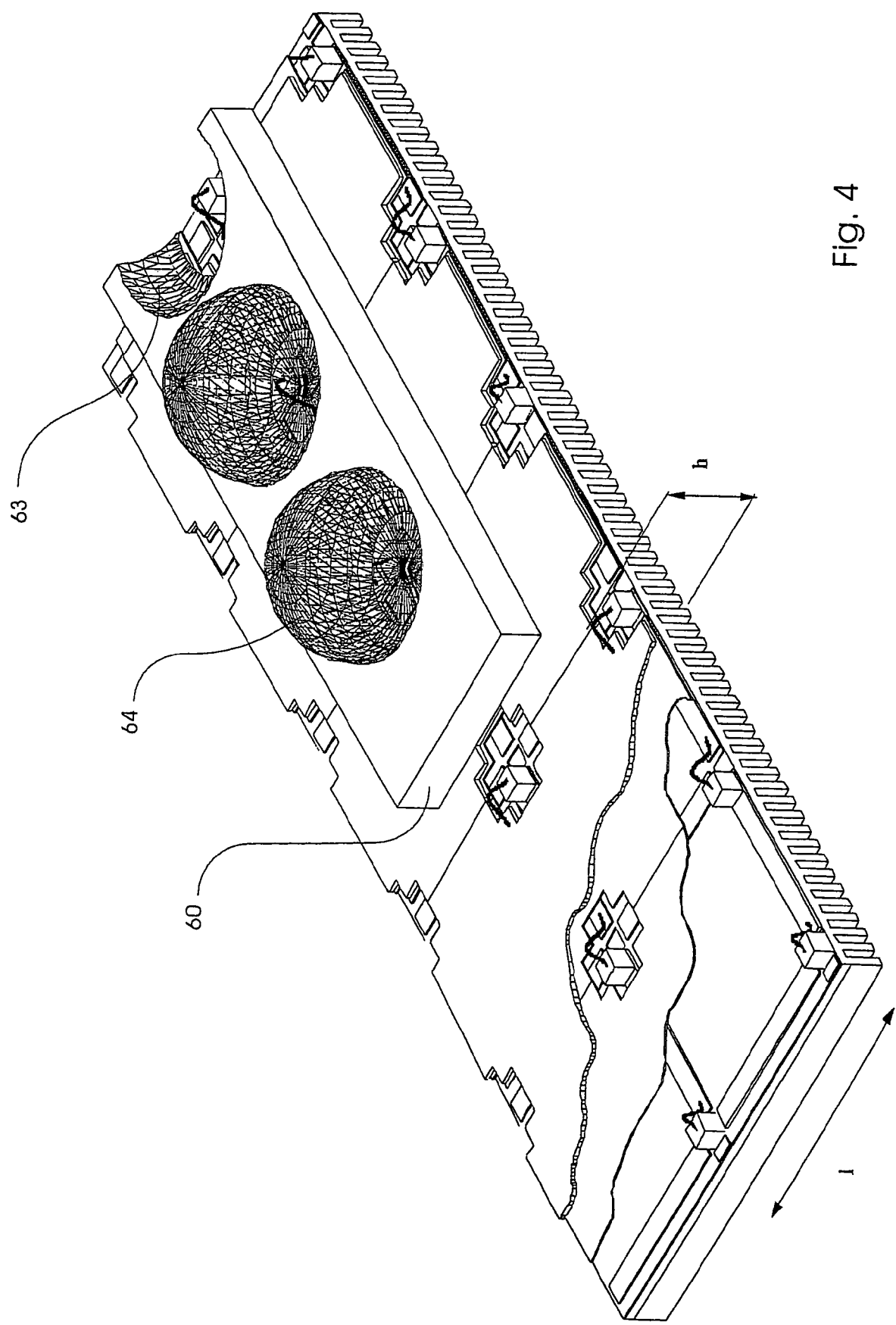
FIG. 4 shows a further embodiment of the light-emitting panel according to the invention with "globe tops"

A further embodiment of the panel according to the invention is to be seen in FIG. 4. The base layer and the layer arrangement including the LED circuitry is essentially the same as in FIG. 3. With this embodiment, an addition layer 60 with semi-shell-shaped recesses 63 is also provided. A transparent material, e.g. silicon is filled into these recesses 63 such that a calotte is formed. Such calottes are called "globe tops" in light-emitting technology. These semi-shell-shaped indentations 64 homogeneously distribute the light that is emitted by the LEDs and possibly modified by protective layers 69, over the whole semi-space to the outside.

The tailorable light-emitting panel according to one of the FIGS. 1 to 4 is manufactured, for example, as follows whilst using unhoused light-emitting diodes.

A first electrically insulating film 2, 22, 42 with a regular array of first openings 7, 27, 47 is deposited on a base layer 1, 21, 41.

Conductor paths 3, 23, 43 are deposited on the first electrically insulating film such that they run in a regular array essentially between first openings. The structuring of the corresponding conductor materials is effected for example in a manner known per se by way of photo-structuring.

A second electrically insulating film 28, 48 is deposited onto the first film and the conductor paths, said film having second openings which encompass the first openings and are larger than these so that conductor paths neighbouring each first opening partly lie free.

The second electrical insulating film is at least partly covered with an electrically conducting cover layer 29, 49, which, again, are structured in a conventional manner.

LEDs 4a, 4b, 4c, 4d, 4e, 4f, 4g, 4h, 4i, 4k, 4l, 4m, 4n, 4o, 4p, 24, 44 are deposited onto the created plate such that they lie within the second openings and are contacted at a first electrode either by the base layer or by the conductor paths.

Second electrodes of the LEDs and conductor paths or the cover layer 29, 49 are electrically connected, wherein the LEDs are so deposited, and the second electrodes of the LEDs are so connected to the conductor paths and the cover layer, that operative sub-units of LEDs connected in series are created.

Subsequently, as the case may be, the addition layers 30, 31, 32, 50, 51, 60 with light-changing and/or directing properties and/or as protective layers are yet to be attached.

Figure 5:
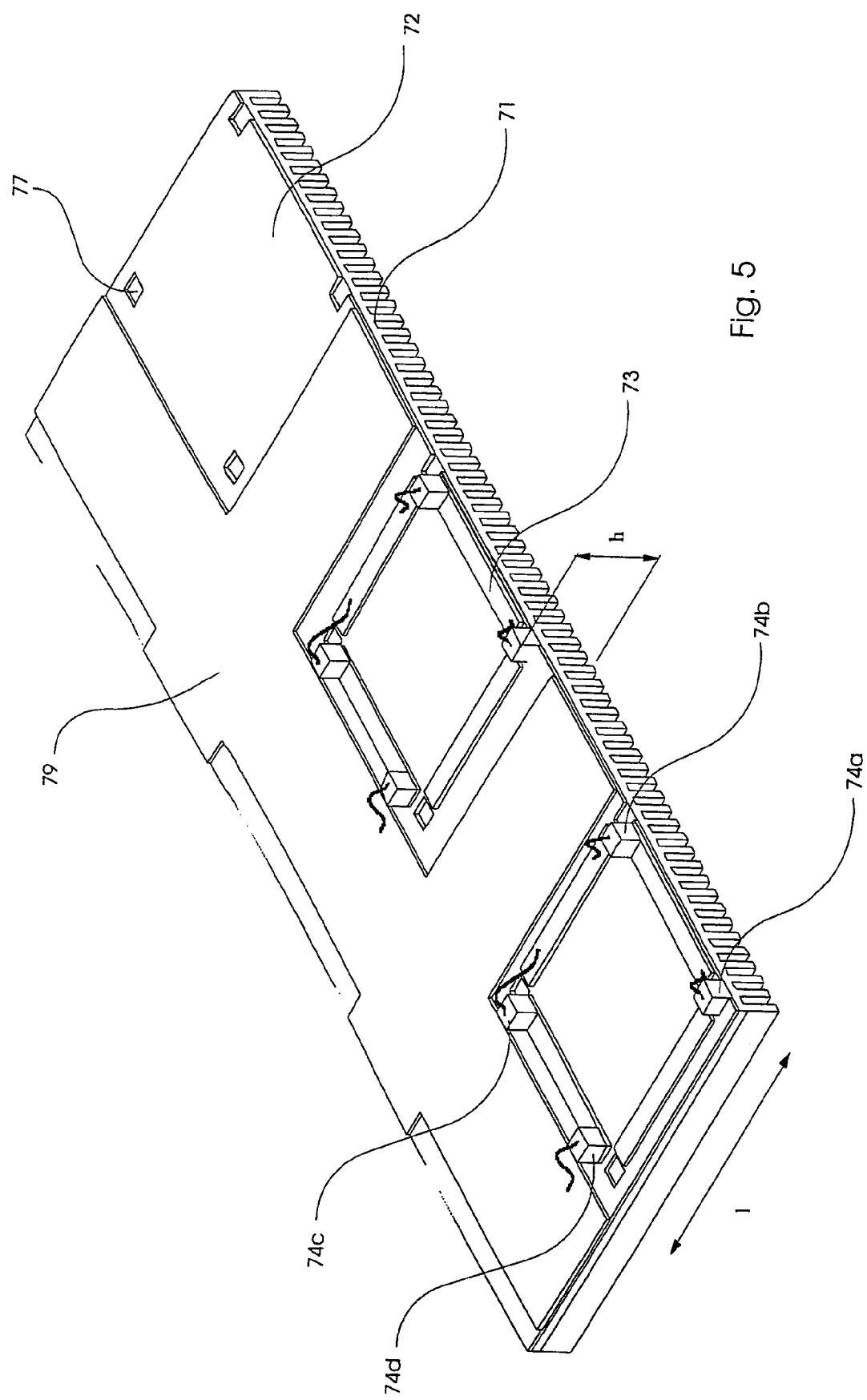
FIG. 5 shows a schematic oblique view of a further embodiment of the light-emitting panel according to the invention.

The embodiment represented in FIG. 5 also has an electrically conducting base layer 71 with (optional) cooling ribs and an electrically insulating layer 72 deposited thereon. This embodiment, however, has the peculiarity that the cover layer 79 and the conductor paths 73 in the layer construction are arranged in the same layer and in the manufacturing process have been manufactured from the same layer. The essential electrical insulation of the conductor paths from the cover layer here is thus no longer effected by a "vertical" separation of conductor paths from the cover layer via an electrically insulating film, but by way of the lateral separation, wherein sections of the insulating layer 72 which lie free are arranged between the cover layer and the conductor paths. For this purpose, the cover layer has large, here essentially square (the shape is not important and may be selected in any manner according to the requirements) openings which, in each case, encompass a complete sub-unit. The first LEDs 74a of the sub-units are accommodated in openings 77 in the insulating layer directly on the base layer 71 and are contacted through these. An upper electrode of the first LEDs is connected to a conductor path by way of a wire bond. The next LEDs 74b of the sub-unit are arranged directly on the conductor paths contacted directly by the "top" electrode of the first LEDs. The third, fourth . . . LEDs may analogously be seated on respective next conductor paths contacted by the preceding LED. The arrangement drawn in the figure is, however, designed different from this. Here, the third LED 74c is attached reversely poled (or attached in reverse) on the same conductor paths as the fourth electrode 74d. The "top" electrode of this LED is likewise connected by a wire bond to the conductor paths contacted by the second LED by way of a wire bond. The conductor paths lying between the second LED 74b and the third LED 74c thus here serves to the first degree for bridging the distance between these two LEDs. The conductor, however, is advantageously used since a wire bond leading from the second to the third LED would be too long and susceptible. One electrode of the fourth LED 74d is connected to the cover layer 79 by a wire bond, as known from the previous embodiments.

The cover layer 79 need not cover the insulating layer up to openings as is shown here, but may likewise be formed out by discrete conductor paths.

As is once again evident from this embodiment, the simple principle according to the invention with conductor paths insulated from electrical connection surfaces, by way of which the light-emitting bodies may be contacted, may be used in a comprehensive manner. The circuit principles shown in the embodiment examples are a pure selection of an unlimited amount of possibilities. In particular, one may deviate from the contacting attachment of one electrode of the light-emitting diodes on the base layer or on a conductor path, which is advantageous per se, and the conductor paths may be used purely as a means for bridging distances. This is of particular significance also with LEDs on an electrically insulating substrate, where electrodes lie on an upper lying surface. In this case, all LEDs may be fastened directly on locations in the base layer which are laid free, and all contacting runs via wire bonds.

The panel of FIG. 5 has a further peculiarity. The sub-units, by way of the fact that they lie completely within openings in the cover layer, are separated from the other sub-units in an optically unambiguously visible manner. This simplifies the fabrication for the user. For this, the sub-units may be designed less flexibly with the presence of a circuit board as a basic element for panel, unless one makes use of the means which are explained by way of the next figure.

As already is the case from the preceding embodiments, it is here again increasingly clear that the cover layer in no way needs to be a covering layer. Cover layer is rather meant simply to be a second electrically conducting layer contacting the sub-units in parallel.

In comparison to the previously cited panels, the panel of FIG. 5 is somewhat simpler in manufacture. The electrically insulating layer may be deposited onto the base layer as a single layer and be provided with a regular array of openings. A conducting layer is subsequently deposited and structured such that, on the one hand, there arises the cover layer 79, which here is two-dimensional, with openings, and, on the other hand, within the openings, discrete conductor layer sections function as conductor paths The light-emitting bodies, as specified in the previous example, are placed onto the base layer or on conductor paths.

The panel of FIG. 5 may of course also be provided with addition layers as described previously.

The complete panel, just as is the case with all other panels, may have an all non-organic construction. In this case the insulating layer is not a polymer layer, as is usually the case per se and is possible also here, but for example is a metal oxide layer. Aluminium oxide is suitable in the example described here, with a base layer of aluminium.

An all non-organic construction has the advantage that all materials have a good endurance also at temperatures of more than 100° C. The panel should be able to endure temperatures for example of at least 120° C., perhaps even of more than 150° C. without becoming damaged.

Figure 6A:
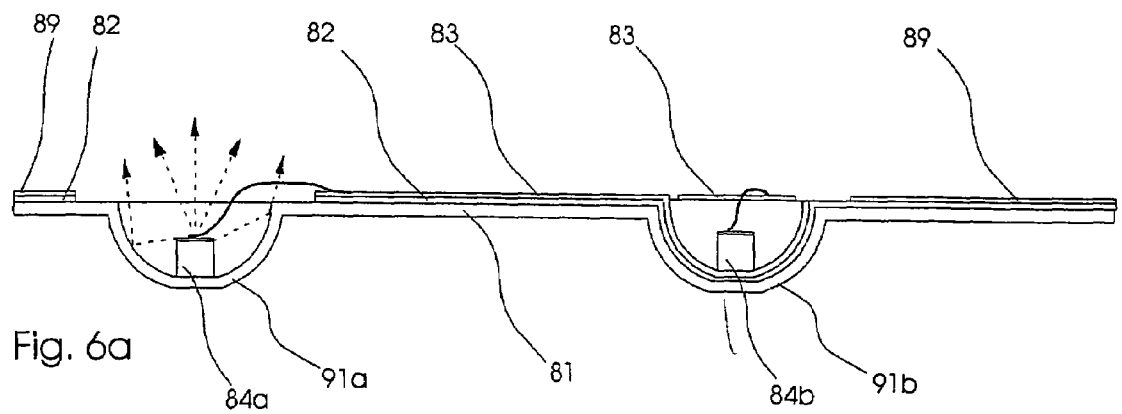
FIGS. 6a and 6b show further designs of light-emitting panels according to the invention.
Figure 6B:
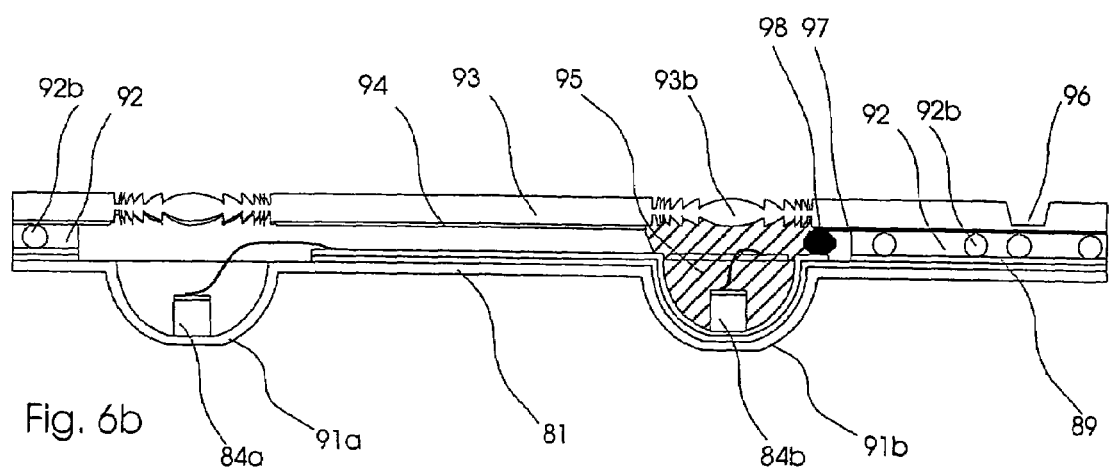

A further embodiment is shown in FIGS. 6a and 6b. Further problems which occur according to the initial situation are solved by way of this embodiment. The light-emitting bodies are better protected, and the optical efficiency may be improved. On account of the construction according to FIGS. 6a and 6b, the addition layer may also be selected in any manner. One, for example, does not need to take the differences in the coefficients of thermal expansion between the base layer and the addition layer into account. The layer construction and the circuiting is designed in the shown example according to FIG. 5, it may, however, also be different, for example, as in the FIGS. 1 to 4.

The base layer (base plate) 81 is metallic and, for example, consists of a good heat-conducting material, such as aluminium, copper, etc. It acts in a manner as described by way of the previous examples as a first parallel conductor and as a heat sink. The base layer 81 here may, of course, also yet comprise cooling ribs. The base layer 81 has several recesses 91a, 91b which have the shape of a part spherical shell or a cut-out of a rotation paraboloid. If the inner surface of the recesses reflects, the recess serves as a reflector element. A flat zone on the lower side of the recesses serves for placing an LED chip. In recesses 91a without an insulation layer, the respective first LED chip 84a of a sub-unit is placed directly onto the base layer, analogously to the previously discussed embodiment examples. The further LED chips 84b of each sub-unit are located in the recesses with an electrical insulation layer 82 and with a discrete conductor layer 83 lying thereon acting also as a reflector layer, for contacting the remaining LED chips of a series LED chain. The cover layer 89, as already described in FIG. 5, is designed with the conductor paths of the discrete conductor layer 83 in the layer system of a single layer, which is particularly advantageous for the manufacture, as will be explained further below.

The panel of FIG. 6b, in addition to the elements of the panel of FIG. 6a, has a modular addition layer 93 which acts as a covering layer. This is preferably selected such that it is as transparent as possible in the visible range, and hardly becomes turbid under UV irradiation. It may consist of plastic (for example of compacted PET), of glass or another transparent material.

The covering layer 93 is an individual element separate from the carrier plate, i.e. it is not for example cast with the carrier plate or the light-emitting bodies lying thereon. It is mechanically decoupled from the carrier plate and the light-emitting bodies in the context that lateral deformations or a different thermal expansion of the carrier plate and the cover plate do not have the result of shear stresses acting of the light-emitting bodies.

The covering layer 93 may be provided with optical elements 93b for influencing the light produced by the LEDs. In the drawing, these optical elements 93b are Fresnel lenses. They may however also comprise reflecting (or mirrored) surfaces, possibly as cut-outs of a parabolic mirror or spherical mirror which may be subdivided into small sections in the manner of a Fresnel lens. The sections, as with a Fresnel lens, may be arranged essentially along one plane, namely the addition layer plane. At the same time, the light output irradiated at a certain desired angle may be increased in relation to the irradiated primary light output by way of a rectifying effect. By way of the excellent convergence, the efficiency may lie close to that of T1¾ housings. An optically effective layer system 94, possibly consisting of a single layer for the complete or partial conversion of blue, violet or ultraviolet light into longer-waved light, may be deposited on the inner side of the addition layer 93. Additionally, for example, by way of a separate layer in the layer system 94, one may envisage the filtering of any occurring excessively present blue light components. The secondary emitting dyes (phosphors) or also filtering substances may also be present in the covering layer as fine particles.

The covering layer is deposited onto the carrier plate (i.e. the base layer 91 with the electrically conducting and electrically insulating layers) with an adhesive layer 92. For the exact vertical positioning of the covering layer, spacer balls may be added to this. Adhesive layers with integrated spacer balls are obtainable today commercially as a film, for example from the company 3M. The thickness of the adhesive layer 92 or the diameter of the spacer balls 92b is selected such that the wire bonds are not touched by the covering layer 93, for example are at least 50 μm. The adhesive layer 92 is structured such that it relieves [leaves open] at least the reflecting zones of the recesses 91a, 91b.

The rear-filling 95 of the optically effective zone with a transparent material is yet shown in the figure. Such a rear-filling may be used in order to ensure an improved coupling-out from the LED-chip and an improved coupling into the transparent covering layer 93. For this, it advantageously has a high refractive index, for example a higher refractive index than the covering layer 93. This rear-filling results in an improvement of the mechanical and chemical protection of the LED chip and of the electrical connections (wire bonds). It may be permanently elastic depending on the selected geometry in order to completely prevent shear stress from being able to act on the LEDs (wherein the LEDs lying in the recesses 91a, 91b are largely protected from shear stress already merely on account of the selected geometry, even if the material of the rear-filling 95 is not elastic).

In the figure, it is also shown how structures 96 of the covering layer 93 may also be present, as the case may be. These structures for example serve as break-off locations or break-off lines and also as decoupling locations for mechanical stresses.

An optional element of the panel of FIG. 6b are the additional, locally present, transparent and opaque conductor paths 97 which run on the underside of the covering layer 93 and which allow a series chain of LEDs to be led over and past the cover layer 89 as a second parallel conductor layer. In the arrangement according to FIG. 5, these additional conductor paths run between individual sub-units present in the openings of the cover layer 79. The reference numeral 98 indicates the electrical connection of a lower conductor paths 83 to an additional conductor paths 97, for example, with a conductive adhesive.

The covering layer may also be composed of several part layers of identical or different materials (not drawn). For example, in the gap between two part layers, a film may be present with the secondary emitting dyes. The covering layer may, of course, also directly contain the secondary emitting dyes, wherein this variant in particular is suitable for covering layers of plastic.

The advantageous shape of the carrier plate with recesses are described below. Given an existing thickness, the stiffness is increased by the recesses. The recesses, as an at least approximate parabolic mirror, increase the light efficiency. The cover plate may be present as a plane element decoupled from the carrier plate which assumes additional tasks (focussing, filtering etc.). As a result of the mechanical decoupling, adverse effects on the LEDs due to thermal expansion shear stresses can be prevented. The cover plate, if it is separated from the carrier plate, permits addition layers to be present on the inner side, which are not subjected to any mechanical wear and therefore do not need to be wear-resistant. And finally, due to the shaping of the recesses, the surface is also increased which entails an improved conducting away of heat.

If the panel of FIG. 6b is manufactured in an all-non-organic construction, the adhesive layer 92 with spacer balls 92b is replaced by a metal film or a glass film which is soldered on the upper and on the lower side (for example with solder or with glass solder) or which is fastened with a bond connection.

In principle, however, a carrier plate with a covering layer decoupled therefrom may also be formed out without the recesses. In this case, however, the distances of these two elements secured by the spacers must be significantly larger than the sum of the thickness of the light-emitting bodies and the height of the wire bond leading away from this, at present thus significantly larger than approx. 250 µm+200 µm. This is too much for many applications.

The manufacture of a carrier plate of a panel according to one of the FIGS. 6a and 6b may be effected analogously to the carrier plates according to the FIGS. 1 to 5, wherein additionally the recesses are yet to be incorporated. The steel balls are ground off such that a flat zone arises. The deep-draw shape or embossing shape which then arises is then used to deform the base layer. The deformation on the base layer in the raw condition or due to the ductility of the usable materials may also be carried out on the already coated base layer without further ado. A yet more directed focussing of the light produced by the LEDs may be accomplished in that the deep-draw mold for incorporating the recesses does not have spherical calotte-like elevations but parabolic ones.

The carrier plate, formed as a printed circuit board for example, as a component of a light-emitting panel, comprises a base layer 1, 21, 41, 71, 81 with an electrically conducting surface, and with an electrically insulating layer deposited thereon with a regular array of first openings and with a regular grid of conductor paths electrically insulated from the base layer as well as with a cover layer electrically insulated from the base layer and the conductor paths and having a regular array of second openings which encompasses the first openings and are larger than these. Definitively, the carrier plate may, for example, be designed, as described by way of the description, of one of the above discussed light-emitting panels.

With the previous discussion, it was practically always assumed that the light-emitting bodies are designed as LEDs. In view of the present state of the art, LEDs are clearly the most suitable light-emitting bodies. It is, however, indeed possible for other light-emitting bodies with a similar functionality to be available in the future. The invention expressly includes such light-emitting bodies that are yet to be developed and are based on existing or new technologies.

The cover layer 29, 49 need not cover the complete panel up to the openings. It may also be only partly covering or may even consist of a system of conductor paths. Furthermore it may be interrupted for example at the break-off locations.

The invention claimed is:

1. A light-emitting panel with a carrier plate which comprises:
   a base layer (1, 21, 41) with an electrically conductive surface,
   an electrically insulating layer deposited on said base layer, said electrically insulating layer defining a regular array of first openings,
   conductor paths arranged in a regular grid-like manner and electrically insulated from the base layer,
   wherein the first openings are arranged at crossing points of the grid of conductor paths and the conductor paths are interrupted at said crossing points, and
   an electrically conducting layer (29, 49, 79, 89) electrically insulated from the base layer and from the conductor paths, said electrically conducting layer having a regular array of second openings that encompass the first openings, said second openings being larger than said first openings,
   with smallest sub-units connected in parallel, each of said smallest sub-units comprising at least two light-emitting bodies (4a, 4b, 4c, 4d, 4e, 4f, 4g, 4h, 4i, 4k, 4l, 4m, 4n, 4o, 4p, 24, 44, 74a, 74b, 74c, 74d, 84a, 84b) that are connected in series and adapted to, be operated by electricity and attached on the carrier plate, wherein the light-emitting bodies of the sub-units are electrically connected in series by the conductor paths,
   wherein the base layer and the electrically conducting layer function as connection surfaces for the electrical parallel contacting of the sub-units, and
   wherein the light-emitting panel, by severing the base layer, may be divided up into part pieces capable of functioning per se with at least the size of the smallest sub-unit.

2. The light-emitting panel according to claim 1, wherein at least some of the light-emitting bodies (4b, 4c, 4e, 4f, 4g, 4h, 4i, 4k, 4l, 4m, 4n, 4o, 4p, 74b, 74c, 74d, 84b) lie directly on one of the conductor paths and are contacted by said one conductor path.

3. The light-emitting panel according to claim 1, wherein each light-emitting body comprises a first and a second electrode, said first electrodes of each first light-emitting body (4a, 4d, 4k, 4n, 74a, 84a) in each sub-unit are contacted by the base layer (1, 21, 41, 71, 81), the second electrode of each last light-emitting body (4c, 4i, 4m, 4p) of each sub-unit is connected by a contact means (5, 25, 45) to the electrically conducting layer (29, 49, 79, 89), and wherein electrodes of the light-emitting bodies lying between each first light-emitting body and each last light-emitting body are connected to one another via conductor paths.

4. The light-emitting panel according to claim 3, wherein first light-emitting bodies (4a, 4d, 4k, 4n, 74a, 84a) of the sub-units, in openings (7, 27, 47, 77) in the insulating layer, are attached on the base layer (1, 21,41,71,91) and are contacted by said base layer via first electrodes, and wherein further light-emitting bodies (4b, 4c, 4e, 4f, 4g, 4h, 4i, 4l, 4m, 4o, 4p) of the sub-units are attached on one of the conductor paths (3, 23, 43) and are contacted by said one conductor path via first electrodes, wherein second electrodes of the last light-emitting bodies (4c, 4i, 4m, 4p) of the sub-units are contacted by the electrically conducting layer (29, 49), and wherein second electrodes of remaining light-emitting bodies of the sub-units are contacted with the conductor path of the respective next light-emitting body of the sub-unit.

5. The light-emitting panel according to claim 4, wherein the light-emitting bodies, despite a predefined distance of the openings (7, 27, 47) in the insulating layer and a limited predefined length of the conductor path (3, 23, 43) for the series electrical connection of the light-emitting bodies of a sub-unit, are arranged at non-uniform distances in that the light-emitting bodies of at least one sub-unit are not attached at each opening (7,27,47) in the insulating layer, but rather at regularly spaced intervals, and thereby leave openings between light-emitting bodies, and wherein electrical interruptions that are present due to openings lacking light-emitting bodies between the conductor paths (3, 23, 43) for the series electrical connection lying therebetween, are bridged by a conductor path contact means (8).

6. The light-emitting panel according to claim 1, wherein mutual electrical insulation of the base layer, the conductor paths and the electrically conducting layer is provided by an electrically insulating layer (2, 22, 42, 72, 82) and wherein the conductor paths (3, 23, 43, 73, 93) run at least partly inside of the electrically insulating layer or inside openings in the electrically insulating layer.

7. The light-emitting panel according to claim 6, wherein the electrically insulating layer is formed by two electrically insulating films, and the conductor paths (3, 23, 43) are located between the first and the second electrically insulating film.

8. The light-emitting panel according to claim 1, further comprising additional electrical components (9, 10) that are connected in parallel or series to individual or to a group of light-emitting bodies (4a, 4b, 4c, 4d, 4e, 4f, 4g, 4h, 4i, 4k, 4l, 4m, 4n, 4o, 4p, 24, 44) of a complete sub-unit connected electrically in series.

9. The light-emitting panel according to claim 1. wherein the base layer (1,21,41) comprises structures for heat removal, or is deposited on a mechanical carrier with structures for heat removal.

10. The light-emitting panel according to claim 1, wherein the light-emitting bodies are LEDs, and at least some of the LEDs are selected from the group consisting of blue light, violet light, and ultraviolet light LEDs.

11. The light-emitting panel according to claim 1, further comprising at least one addition layer (30, 32, 50, 51, 93, 94) that is at least partly transparent and arranged such that the light-emitting bodies are located between the base layer and the addition layer, or are cast into the addition layer.

12. The light-emitting panel according to claim 11, wherein the at least one addition layer is transparent and is provided with light directing means, said means being selected from the group consisting of reflecting particles, optical elements, and structures (53, 63, 64, 93b) for directing and/or distributing light.

13. The light-emitting panel according to claim 11, wherein the least one addition layer (31,50,60,94) is provided with a secondary emitting dye.

14. The light-emitting panel according to claim 13, wherein the addition layer with secondary emitting dye is essentially flat and covers a plurality of light-emitting bodies.

15. The light-emitting panel according to claim 13, wherein the at least one addition layer (93) is attached as a covering layer onto a carrier plate carrying the light-emitting bodies and is mechanically decoupled from the light-emitting bodies, and wherein spacer means (92b) are present between the carrier plate and the covering layer (93).

16. The light-emitting panel according to claim 15, wherein a secondary emitting film (94) is deposited on a side of the covering layer (93) that faces the light-emitting bodies or between at least two part layers forming the covering layer.

17. The light-emitting panel according to claim 15, wherein the covering layer in regions above the light-emitting bodies comprises optical elements (93b), said optical elements being selected from the group consisting of, Fresnel lenses and structures with surfaces that reflect such that a directing effect arises.

18. The light-emitting panel according to claim 1, wherein the base layer comprises a regular array of recesses (91a) in which at least some of said light-emitting bodies are attached.

19. The light-emitting panel according to claim 18, wherein the recesses are provided with a coating functioning as a reflector layer and wherein the recesses have a shape selected from the group consisting of ball shell or paraboloid, with a flat zone.

20. The light-emitting panel according to claim 1, wherein said panel is free of organic materials.

21. A carrier plate, for use as a component of a light-emitting panel, comprising a base layer (1, 21, 41) with an electrically conductive surface, an electrically insulating layer deposited on said base layer and having a regular array of first openings formed therein, and conductor paths arranged in a regular grid-like manner on said insulating layer and electrically insulated from the base layer, wherein the first openings are arranged at crossing points of the conductor path grid and the conductor paths are interrupted at said crossing points, wherein an electrically conducting layer, which is electrically insulated from the base layer and the conductor paths, defines a regular array of second openings that encompass the first openings, said second openings having a size that is larger than a size of said first openings.

* * * * *